United States Patent
Lee

(10) Patent No.: US 8,129,848 B2
(45) Date of Patent: Mar. 6, 2012

(54) LIGHT EMITTING DEVICE HAVING A PLURALITY OF LIGHT EMITTING CELLS CONNECTED IN SERIES AND METHOD OF FABRICATING THE SAME

(75) Inventor: Chung Hoon Lee, Gwangmyeong-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 12/772,015

(22) Filed: Apr. 30, 2010

(65) Prior Publication Data
US 2010/0219425 A1 Sep. 2, 2010

Related U.S. Application Data

(63) Continuation of application No. 11/813,812, filed as application No. PCT/KR2005/002115 on Jul. 4, 2005, now Pat. No. 7,763,900.

(30) Foreign Application Priority Data

Jan. 26, 2005 (KR) .................. 10-2005-0007310

(51) Int. Cl.
*H01L 23/48* (2006.01)

(52) U.S. Cl. .................. 257/786; 257/88; 257/E25.02; 438/612; 438/666

(58) Field of Classification Search ............ 257/88, 257/E25.02, 786
See application file for complete search history.

(56) References Cited

U.S. PATENT DOCUMENTS

| 4,775,645 | A | 10/1988 | Kurata et al. | |
| 5,433,295 | A * | 7/1995 | Murphy | 187/397 |
| 5,936,599 | A | 8/1999 | Reymond | |
| 5,953,617 | A * | 9/1999 | Lee | 438/329 |
| 6,410,942 | B1 | 6/2002 | Thibeault et al. | |
| 6,547,249 | B2 | 4/2003 | Collins, III et al. | |
| 7,206,507 | B2 * | 4/2007 | Lee et al. | 396/182 |
| 7,417,259 | B2 | 8/2008 | Sakai | |
| 2003/0189830 | A1 | 10/2003 | Sugimoto et al. | |

(Continued)

FOREIGN PATENT DOCUMENTS

EP 1249873 A2 * 10/2002

(Continued)

OTHER PUBLICATIONS

Final Office Action dated Mar. 9, 2010 in U.S. Appl. No. 11/813,812.

(Continued)

*Primary Examiner* — Ajay K Arora
(74) *Attorney, Agent, or Firm* — H.C. Park & Associates, PLC

(57) ABSTRACT

Disclosed are a light emitting device having a plurality of light emitting cells connected in series and a method of fabricating the same. The light emitting device includes a buffer layer formed on a substrate. A plurality of rod-shaped light emitting cells are located on the buffer layer to be spaced apart from one another. Each of the light emitting cells has an n-layer, an active layer and a p-layer. Meanwhile, wires connect the spaced light emitting cells in series or parallel. Accordingly, arrays of the light emitting cells connected in series are connected to be driven by currents flowing in opposite directions. Thus, there is provided a light emitting device that can be directly driven by an AC power source.

15 Claims, 3 Drawing Sheets

U.S. PATENT DOCUMENTS

| | | | |
|---|---|---|---|
| 2004/0217362 A1 | 11/2004 | Slater, Jr. et al. | |
| 2005/0063033 A1* | 3/2005 | Kinsman | 359/245 |
| 2006/0208273 A1 | 9/2006 | Kang | |

FOREIGN PATENT DOCUMENTS

| | | |
|---|---|---|
| JP | 8330636 | 12/1996 |
| JP | 10321915 | 12/1998 |
| JP | 2001-156331 | 6/2001 |
| JP | 2004-079867 | 3/2004 |
| WO | 2004/023568 | 3/2004 |

OTHER PUBLICATIONS

Non-Final Office Action dated Aug. 21, 2009 in U.S. Appl. No. 11/813,812.

* cited by examiner

[Fig. 1]
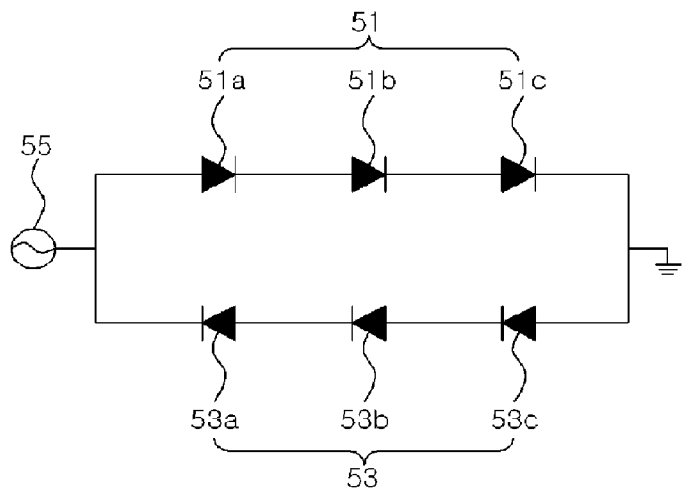
[Fig. 2]
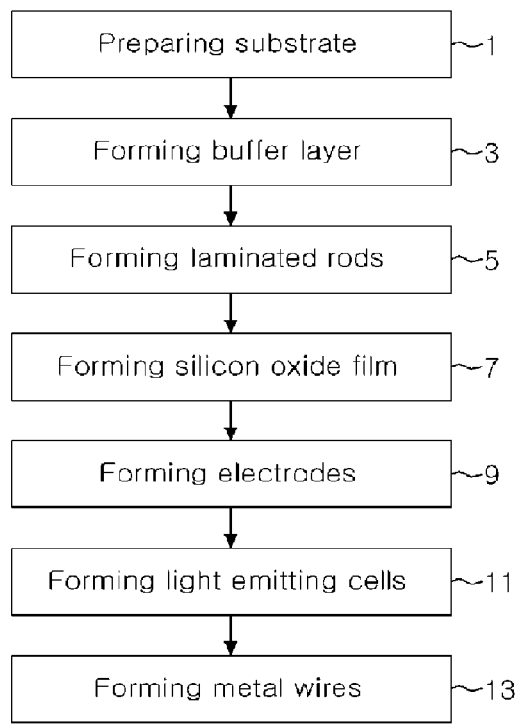
[Fig. 3]
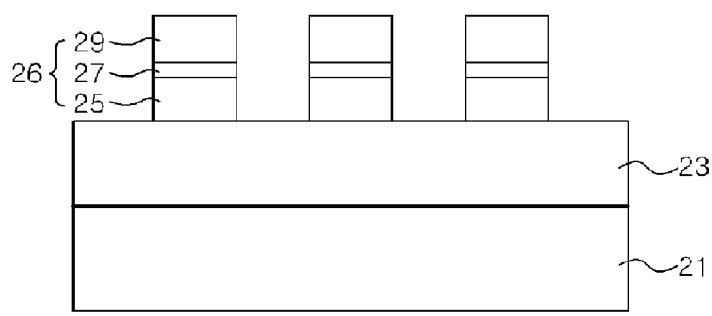

[Fig. 4]
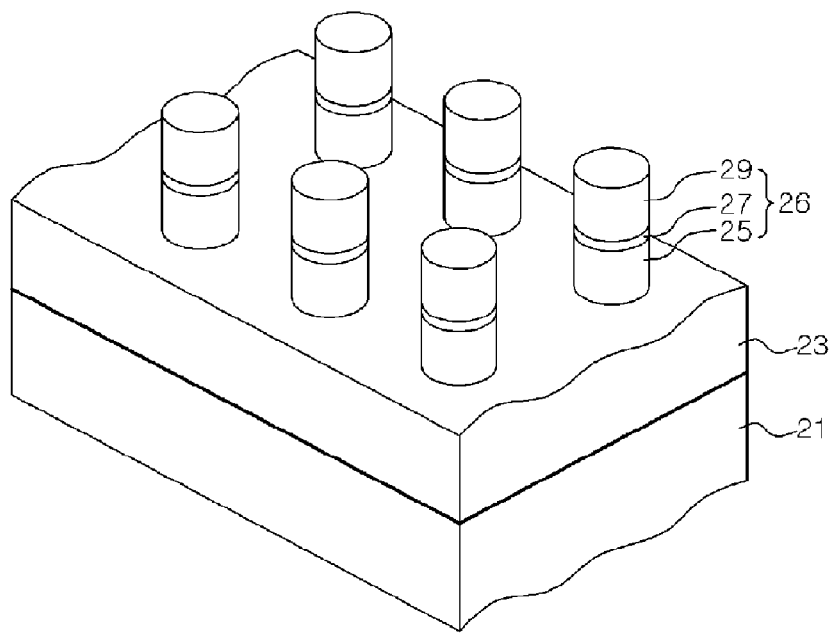
[Fig. 5]
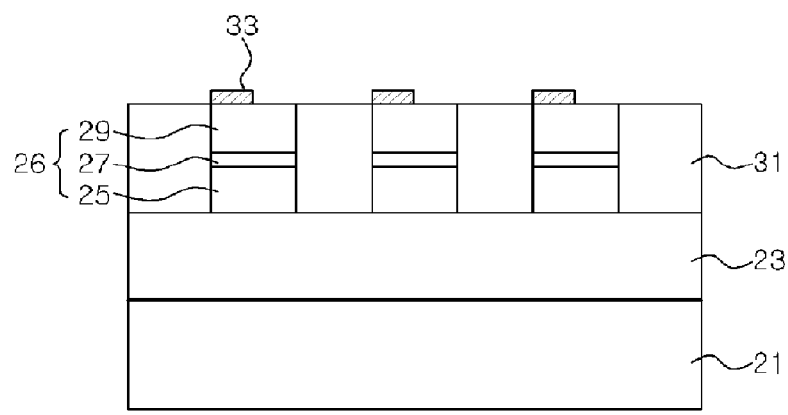
[Fig. 6]
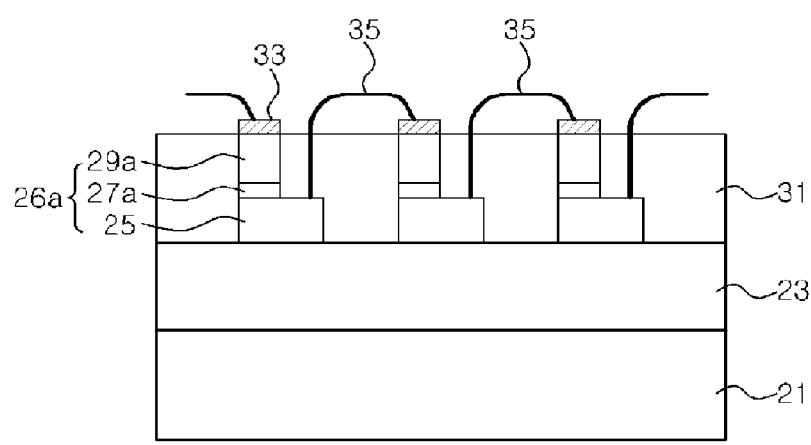

[Fig. 7]
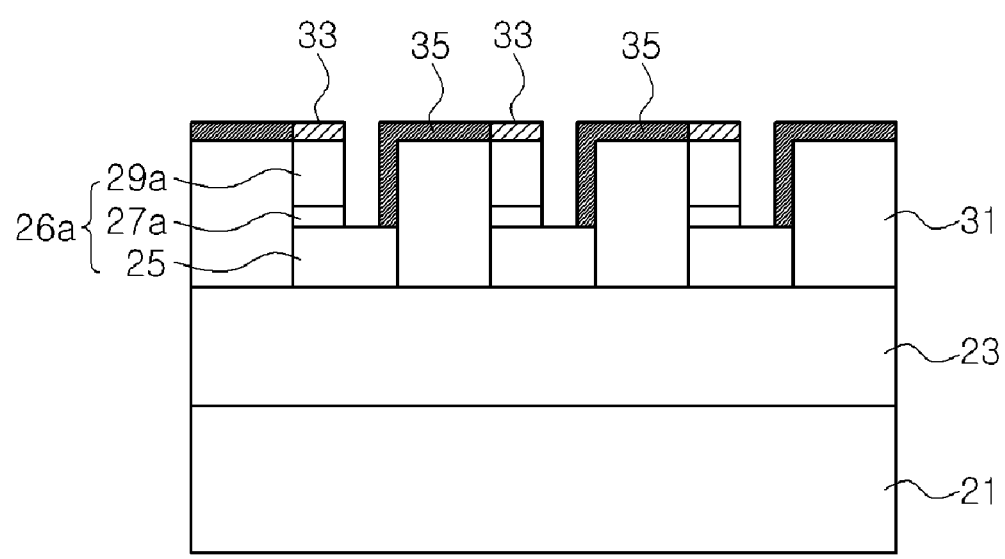

LIGHT EMITTING DEVICE HAVING A PLURALITY OF LIGHT EMITTING CELLS CONNECTED IN SERIES AND METHOD OF FABRICATING THE SAME

CROSS REFERENCE TO RELATED APPLICATIONS

This application is a continuation of U.S. patent application Ser. No. 11/813,812, filed Jul. 12, 2007, which is a National Stage Application of International Application No. PCT/KR2005/002115, filed Jul. 4, 2005, and claims priority from and the benefit of Korean Patent Application No. 10-2005-0007310, filed on Jan. 26, 2005, which are hereby incorporated by reference for all purposes as if fully set forth herein.

BACKGROUND OF THE INVENTION

1. Field of the Invention

The present invention relates to a light emitting device, and more particularly, to a light emitting device having a plurality of light emitting cells, wherein the plurality of light emitting cells are arranged in serial arrays on a single substrate so as to be directly driven using an AC power source.

2. Discussion of the Background

A light emitting diode is a electroluminescence device having a structure in that an n-type semiconductor of which major carriers are electrons and a p-type semiconductor of which major carriers are holes are joined together, and emits predetermined light through recombination of these electrons and holes. Such light emitting diodes are used as display devices and backlights, and their application area has expanded to general illumination while substituting the conventional incandescent bulbs and fluorescent lamps.

A light emitting diode consumes less electric power and has a longer service life as compared with conventional light bulbs or fluorescent lamps. The electric power consumption of a light emitting diode is less than a few tenths to a few hundredths of that of conventional illumination devices, and the life span thereof is several to several ten times, thereby having reduced electric power consumption and excellent durability.

However, the light emitting diode is repeatedly turned on and off depending on the direction of a current. Therefore, if the light emitting diode is used while being connected directly to an AC power source, there is a problem in that the light emitting diode may be easily damaged. Accordingly, it is difficult to use a light emitting diode for the purpose of general illumination by connecting it directly to a household AC power source.

SUMMARY OF THE INVENTION

An object of the present invention is to provide a light emitting device that comprises light emitting diodes, which can be connected directly to and driven by an AC power source.

Another object of the present invention is to provide a method of fabricating a light emitting device that can be connected directly to and driven by an AC power source.

According to an aspect of the present invention for achieving the object, there is provided a light emitting device having a plurality of light emitting cells connected in series. The light emitting device according to the aspect of the present invention includes a buffer layer formed on a substrate. A plurality of rod-shaped light emitting cells are located on the buffer layer to be spaced apart from one another. Each of the plurality of light emitting cells has an p-layer, an active layer and a p-layer. Meanwhile, wires connect the spaced light emitting cells in series or parallel. Accordingly, arrays of the light emitting cells connected in series can be connected to be driven by currents flowing in opposite directions. Thus, there is provided a light emitting device that can be directly driven by an AC power source.

The light emitting device of the present invention has a plurality of light emitting diodes on a single substrate. Thus, the term "light emitting cell" means each of the plurality of light emitting diodes formed on the substrate. Further, the term "array of serial light emitting cells" means a structure having a plurality of light emitting cells connected in series.

Meanwhile, electrodes may be interposed between the wires and the p-layers. The electrodes form ohmic contacts with the p-layers, thereby reducing junction resistances.

According to another aspect of the present invention for achieving the another object, there is provided a method of fabricating a light emitting device having a plurality of light emitting cells connected in series. The fabricating method according to the other aspect of the present invention comprises the step of forming a buffer layer on a substrate. A plurality of laminated rod-shaped light emitting cells each of which has an n-layer, an active layer and a p-layer sequentially formed are formed on the buffer layer. Thereafter, the p-layers and the active layers are partially etched in sequence until the n-layers are partially exposed. As a result, a plurality of light emitting cells are formed. In addition, wires for connecting the exposed n-layers of light emitting cells and the etched p-layers of adjacent light emitting cells are formed to connect the plurality of light emitting cells in series or parallel. According to the another aspect of the present invention, there is provided a light emitting device having a plurality of light emitting cells connected in series, which can be connected directly to and driven by an AC power source. Further, since laminated rods spaced apart from one another can be formed on the buffer layer, an etching process for separating the light emitting cells can be eliminated.

Meanwhile, electrodes may be formed on the p-layers after forming the insulating film. The electrodes are in ohmic contacts with the P layers, thereby reducing junction resistances.

According to the embodiments of the present invention, there is provided a light emitting device that comprises light emitting diodes, which can be connected directly to and driven by an AC power source. Therefore, the light emitting device can be used for the purpose of general illumination using a household AC power source. Further, there is provided a method of fabricating the light emitting device that can be connected directly to and driven by the AC power source. According to this method, it is possible to eliminate an etching process for separating the light emitting cells.

BRIEF DESCRIPTION OF THE DRAWINGS

FIG. 1 is a circuit diagram illustrating an operational principle of a light emitting device having a plurality of light emitting cells connected in series according to an embodiment of the present invention.

FIG. 2 is a flow chart illustrating a method of fabricating a light emitting device having a plurality of light emitting cells connected in series according to an embodiment of the present invention.

FIGS. 3 to 7 are sectional views illustrating the method of fabricating the light emitting device having the plurality of light emitting cells connected in series according to the embodiment of the present invention, wherein FIG. 4 is a perspective view of FIG. 3.

DETAILED DESCRIPTION OF THE ILLUSTRATED EMBODIMENTS

Hereinafter, embodiments of the present invention will be described in detail with reference to the accompanying drawings.

The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration Like reference numerals indicate like elements throughout the specification and drawings.

FIG. 1 is a circuit diagram illustrating an operational principle of a light emitting device having a plurality of light emitting cells connected in series according to an embodiment of the present invention.

Referring to FIG. 1, a first serial array 51 is formed by connecting light emitting cells 51a, 51b and 51c in series, and a second serial array 53 is formed by connecting light emitting cells 53a, 53b and 53c in series.

Both ends of each of the first and second serial arrays 51 and 53 are connected to an AC power source 55 and a ground, respectively. The first and second serial arrays 51 and 53 are connected in parallel between the AC power source 55 and the ground. In other words, the is both ends of the first serial array 51 are electrically connected to those of the second serial array 53.

Meanwhile, the first and second serial arrays 51 and 53 are arranged such that their light emitting cells are driven by currents flowing in opposite directions. In other words, as shown in the figure, anodes and cathodes of the light emitting cells included in the first serial array 51 and anodes and cathodes of the light emitting cells included in the second array 53 are arranged in opposite directions.

Thus, if the AC power source 55 is in a positive phase, the light emitting cells included in the first serial array 51 are turned on to emit light, and the light emitting cells included in the second serial array 53 are turned off. On the contrary, if the AC power source 55 is in a negative phase, the light emitting cells included in the first serial array 51 are turned off, and the light emitting cells included in the second serial array 53 are turned on.

Consequently, the first and second serial arrays 51 and 53 are alternately turned on and off by the AC power source so that the light emitting device including the first and second serial arrays 51 and 53 continues to emit light.

Although light emitting chips each of which comprises a single light emitting diode can be connected to one another to be driven by an AC power source as in the circuit of FIG. 1, the space occupied by the light emitting chips is increased. On the contrary, in the light emitting device of the present invention, a single chip can be driven by connecting it to an AC power source, thereby preventing an increase in the space occupied by the light emitting device.

Meanwhile, although the circuit shown in FIG. 1 is configured such that the both ends of each of the first and second serial arrays 51 and 53 are connected to the AC power source 55 and the ground, respectively, the circuit may be configured such that the both ends thereof are connected to both terminals of the AC power source. Further, although each of the first and second serial arrays 51 and 53 has three light emitting cells in FIG. 1, this is only an illustrative example for better understanding and the number of light emitting cells may be increased, if necessary. The number of serial arrays may also be increased.

FIG. 2 is a flow chart illustrating a method of fabricating a light emitting device having a plurality of light emitting cells connected in series according to an embodiment of the present invention. FIGS. 3 to 6 are sectional views illustrating the method of fabricating the light emitting device having the plurality of light emitting cells connected in series according to the embodiment of the present invention. Meanwhile, FIG. 4 is a perspective view of FIG. 3.

Referring to FIGS. 2 and 3, a substrate 21 on which light emitting cells are to be formed is provided (Step 1). The substrate 21 may be a substrate made of sapphire ($Al_2O_3$), silicon carbide (SiC), zinc oxide (ZnO), silicon (Si), gallium arsenide (GaAs), gallium phosphorus (GaP), lithium aluminum oxide ($LiAl_2O_3$), boron nitride (BN), aluminum nitride (AlN) or gallium nitride (GaN). The substrate 21 is selected in consideration of a lattice constant of a semiconductor layer to be formed thereon. For example, if a GaN based semiconductor layer is formed on the substrate 21, it is preferred that the substrate 21 be a sapphire substrate.

A buffer layer 23 is formed on the substrate 21 (Step 3). The buffer layer 23 is used to reduce stress generated due to a difference between the lattice constants of the substrate 21 and the semiconductor layer to be formed thereon. A semiconductor layer based on a III-N group such as AlN, GaN or InN may be used as the buffer layer 23. Here, the buffer layer 23 is not additionally doped with impurities to prevent an excess current from flowing through the buffer layer 23. The buffer layer 23 may be formed using a hydride vapor phase epitaxy (HVPE) method, a chemical vapor deposition (CVD) method or a metalorganic chemical vapor deposition (MOCVD) method. Thus, it is possible to form a thin buffer layer 23.

Laminated rods 26 each of which has an n-type semiconductor rod 25, an active layer 27 and a p-type semiconductor rod 29 sequentially laminated are formed on the buffer layer 23 (Step 5). The laminated rods 26 may be formed using HYPE, CVD or MOCVD. At this time, as shown in FIG. 4, the laminated rods 26 are spaced apart from one another on the buffer layer 23.

The n-type semiconductor rod 25 may be formed of GaN doped with impurities, e.g., silicon (Si), and the p-type semiconductor rod 29 may be formed of GaN doped with impurities, e.g., magnesium (Mg). Meanwhile, the active layer 27 generally has a multi-layered film structure in which quantum well layers and barrier layers are repeatedly formed. The quantum well layers and the barrier layers may be formed out of an $Al_xIn_yGa_{1-x-y}N$ ($0 \leq x$, $y \leq 1$, $0 \leq x+y \leq 1$) compound and have p-type or n-type impurities injected thereinto.

An insulating film 31 is formed on the substrate having the laminated rods 26 to fill empty spaces between the adjacent laminated rods 26 (Step 7). The insulating film 31 is formed of silicon oxide ($SiO_2$) by means of a chemical vapor deposition (CVD) method. After the silicon oxide film with a sufficient thickness is formed by means of the chemical vapor deposition method, the insulating film 31 is flattened until top surfaces of the laminated rods 26 are exposed. As a result, the insulating film 31 for filling empty spaces is formed, and the laminated rods 26 are exposed on a top surface of the insulating film 31.

Referring to FIGS. 2 and 5, electrodes 33 may be formed on the exposed surfaces of the laminated rods 26. The electrodes 33 can be formed by forming an electrode layer on the substrate having the insulating film 31 formed thereon and patterning the electrode layer. The electrodes 33 are formed on the p-type semiconductor rods 29 to form an ohmic contact therewith.

Referring to FIGS. 2 and 6, the p-type semiconductor rods 29 and the active layers 27 are etched, and the n-type semiconductor rods 25 are exposed. As a result, light emitting cells 26a each of which includes the n-type semiconductor rod 25, an etched active layer 27a and an etched p-type semiconductor layer 29a are formed (Step 11).

When the p-type semiconductor rod 29 and the active layer 27 are etched, the adjacent insulating film 31 may be etched. Further, the electrodes 33 may be formed during this etching process. That is, after the electrode layer is formed, the p-type semiconductor rods 29 and the active layers 27 are sequentially etched together with the electrode layer so that the electrodes 33 can be formed. In this case, the additional patterning process for forming the electrode 33 may be eliminated.

Thereafter, metal wires 35 for electrically connecting the n-type semiconductor rods 25 to the etched p-type semiconductor rods 29a are formed (Step 13). The metal wires serially 35 connect the adjacent light emitting cells 26a to each other, thereby forming an array of serial light emitting cells 26a. The metal wires 35 connect the n-type semi-conductor rods 25 to the electrodes 33. Further, before the metal wires 35 are formed, electrodes for ohmic contacts are additionally formed on the exposed portions of the n-type semiconductor rods 25. Meanwhile, if the metal wires 35 form ohmic contacts with the p-type semiconductor rod 29a, the electrodes 33 may be eliminated.

The metal wires 35 can be formed by means of an air bridge method or step-cover method. Meanwhile, to prevent the n-type semiconductor rod 25 and the p-type semi-conductor rod 29a, and the n-type semiconductor rod 25 and the active layer 27a in the same light emitting cell 26a from being electrically connected directly to each other through the metal wire 35, a spacer (not shown) may be formed on side walls of the p-type semiconductor rod 29a and active layer 27a.

At least two arrays of serial light emitting cells 26a can be formed on the substrate 21 through the metal wires 35, and the arrays are connected to a power source so as to be driven by currents flowing in opposite directions. Accordingly, it is possible to fabricate a light emitting device that can be connected directly to and then driven by an AC power source. Further, according to the embodiment of the present invention, since the laminated rods 26 spaced apart from one another are formed, it is possible to eliminate an etching process for electrically separating light emitting cells 26a.

The structure of a light emitting device according to an aspect of the present invention will be described in detail below.

Referring again to FIG. 6, the light emitting device includes a substrate 21. The substrate 21 may be a sapphire substrate. A buffer layer 23 is located on the substrate 21. The buffer layer 23 may be formed of GaN using a metalorganic chemical vapor deposition (MOCVD) method.

A plurality of light emitting cells 26a spaced apart from one another are located on the buffer layer 23. Each of the light emitting cells 26a comprises an n-type semi-conductor rod 25, an etched p-type semiconductor rod 29a, and an etched active layer 27a interposed between the n-type semiconductor rod 25 and the p-type semiconductor rod 29a.

The n-type semiconductor rod 25 may be formed of GaN doped with impurities, e.g., silicon (Si), and the p-type semiconductor rod 29a may be formed of GaN doped with impurities, e.g., magnesium (Mg). Further, the etched active layer 27a may have a multi-layered film structure in which quantum well layers and barrier layers are repeatedly formed. The quantum well layers and the barrier layers may be formed out of an $Al_xIn_yGa_{1-x-y}N$ ($0 \leq x$, $y \leq 1$, $0 \leq x+y \leq 1$) compound and have p-type or n-type impurities injected thereinto.

Each of the active layer 27a and the p-type semiconductor rod 29a has a smaller area as compared with that of the n-type semiconductor rod 25. Therefore, a portion of the n-type semiconductor rod 25 is exposed. Metal wires 35 connect the exposed n-type semiconductor rods 25 to the p-type semiconductor rods 29a to form arrays of light emitting cells 26a connected in series.

As shown in the figure, although the light emitting cells 26a can be connected in series on a straight line, the present invention is not limited thereto. The light emitting cells 26a may be connected to one another in a zigzag arrangement.

Meanwhile, an electrode 33 may be interposed between the metal wire 35 and the p-type semiconductor rod 29a. The electrode 33 is in ohmic contact with the p-type semi-conductor rod 29a, thereby reducing the junction resistance.

Further, an insulating film 31 may be interposed between the light emitting cell 26a and the metal wire 35. The insulating film 31 may be a silicon oxide film. In addition, a spacer (not shown) may be interposed between the metal wire 35 and the etched p-type semiconductor rod 29a and active layer 27a. The spacer may be employed to separate the metal wire 35 from the p-type semiconductor rod 29a and the active layer 27a.

According to the embodiments of the present invention, there is provided a light emitting device that comprises light emitting diodes, which can be connected directly to and driven by an AC power source. Therefore, the light emitting device can be used for the purpose of general illumination using a household AC power source. Further, there is provided a method of fabricating the light emitting device that can be connected directly to and driven by the AC power source. According to this method, it is possible to eliminate an etching process for separating the light emitting cells.

What is claimed is:

1. A light emitting device comprising:
    a substrate;
    a plurality of light emitting cells formed in rod shapes and spaced apart from one another on the substrate, each of the light emitting cells having an n-layer, an active layer and a p-layer;
    an electrode arranged on one of the n-layer or the p-layer;
    an insulating film; and
    wires connecting the spaced light emitting cells in series to form a first serial array of light emitting cells,
    wherein at least one of the n-layer and the p-layer is cylindrical rod-shaped,
    wherein the wires are disposed on the insulating film, and a first wire contacts an outer surface of the insulating film and connects to the electrode, and
    wherein the wires comprise a step-cover structure.

2. The light emitting device of claim 1, further comprising a buffer layer disposed between the substrate and the plurality of light emitting cells, wherein the buffer layer is formed of a III-N group material.

3. The light emitting device of claim 1, wherein the rod-shaped light emitting cells are formed of a gallium nitride based compound.

4. The light emitting device of claim 1, wherein the insulating film fills empty spaces between the light emitting cells.

5. The light emitting device of claim 1, further comprising:
a plurality of second light emitting cells formed in rod shapes and spaced apart from one another on the substrate, each of the second light emitting cells having an n-layer, an active layer and a p-layer; and
wires connecting the spaced second light emitting cells in series to form a second serial array of second light emitting cells,
wherein the first serial array of light emitting cells is configured to be driven by a positive phase of an alternating current power source, and the second serial array of second light emitting cells is configured to be driven by a negative phase of the alternating current power source.

6. The light emitting device of claim 1, wherein a portion of the first wire is arranged directly on the outer surface of the insulating film along an extending direction of the first wire.

7. The light emitting device of claim 6, wherein the portion of the first wire is arranged only on the outer surface of the insulating film.

8. The light emitting device of claim 1, wherein a side surface of the first wire contacts the outer surface of the insulating film.

9. A method of fabricating a light emitting device having a plurality of light emitting cells, the method comprising:
forming a plurality of laminated rod-shaped light emitting cells, each of the light emitting cells having an n-layer, an active layer and a p-layer sequentially formed on a substrate;
etching the p-layers and the active layers until the n-layers are partially exposed;
forming an insulating film; and
connecting each of the exposed portions of the n-layers to the p-layer of an adjacent light emitting cell through wires in series or parallel after forming the insulating film,
wherein at least one of the n-layer and the p-layer is cylindrical rod-shaped,
wherein an n-layer of a first light emitting cell is connected to a p-layer of a second light emitting cell via a wire using a step-cover method, and
wherein the wire is disposed on the insulating film.

10. The method of claim 9,
forming a buffer layer on the substrate,
wherein an upper surface of the buffer layer comprises first areas and a second area surrounding the first areas, and the light emitting cells are formed directly on the upper surface of the buffer layer in the first areas, respectively, and the insulating film is formed directly on the upper surface of the buffer layer in the second area.

11. The method of claim 9, wherein each of the active layer and the p-layer comprise a side surface that extends in a direction away from the substrate, and the side surface of the active layer and the side surface of the p-layer are etched surfaces, wherein at least a portion of a side surface of the n-layer extending in a direction away from the substrate is a non-etched surface.

12. The method of claim 10, further comprising:
exposing a portion of the light emitting cells;
forming an electrode layer on the exposed portion of the light emitting cells; and
forming an electrode on each of the light emitting cells by patterning the electrode layer.

13. The method of claim 10, further comprising:
exposing a portion of the light emitting cells;
forming an electrode layer on the exposed portion of the light emitting cells; and
sequentially patterning the active layer and the p-layer of the plurality of light emitting cells and the electrode layer,
wherein patterning the electrode layer forms an electrode on each of the light emitting cells.

14. The method of claim 13, further comprising:
forming a metal wire to connect the n-layer of a first light emitting cell and the p-layer of a second light emitting cell,
wherein the insulating film is interposed between the metal wire and side surfaces of each of the light emitting cells.

15. The method of claim 14, further comprising:
forming at least two serial arrays of light emitting cells by connecting the n-layer to the p-layer of adjacent light emitting cells; and
connecting the at least two serial arrays in inverse parallel,
wherein the light emitting device operates using an alternating current (AC) power source.

* * * * *